US 7,488,384 B2

(12) United States Patent
Van Patten et al.

(10) Patent No.: US 7,488,384 B2
(45) Date of Patent: Feb. 10, 2009

(54) DIRECT PYROLYSIS ROUTE TO GAN QUANTUM DOTS

(75) Inventors: Paul Gregory Van Patten, Athens, OH (US); Guiquan Pan, Athens, OH (US)

(73) Assignee: Ohio University, Athens, OH (US)

( * ) Notice: Subject to any disclaimer, the term of this patent is extended or adjusted under 35 U.S.C. 154(b) by 195 days.

(21) Appl. No.: 11/416,546

(22) Filed: May 3, 2006

(65) Prior Publication Data

US 2007/0256629 A1 Nov. 8, 2007

(51) Int. Cl.
*C30B 1/10* (2006.01)
(52) U.S. Cl. ................ 117/3; 117/4; 117/7; 117/8; 117/944
(58) Field of Classification Search ......... 117/3, 117/4, 7, 8, 940
See application file for complete search history.

(56) References Cited

U.S. PATENT DOCUMENTS

| | | | | |
|---|---|---|---|---|
| 6,177,057 | B1 * | 1/2001 | Purdy | 423/409 |
| 7,252,712 | B2 * | 8/2007 | Dwilinski et al. | 117/68 |
| 2004/0238810 | A1 * | 12/2004 | Dwilinski et al. | 257/12 |

OTHER PUBLICATIONS

Benaissa, M. et al. "Nanostructured GaN: Microstructure and Optical Properties", Physical Review B, vol. 54, No. 24, pp. 17763-17767, Dec. 15, 1996.

Brus, LE "Electron-electron and electron-hole interactions in small semiconductor crystallites: The size dependence of the lowest excited electronic state", J. Chem. Phys 80 (9), pp. 4403-4409, May 1, 1984.
Coffer, J.L. et al., "Influence of Precursor Route on the Photoluminescense of Bulk Nanocrystalline Gallium Nitride", Chem. Mater. 9, pp. 2671-2673, 1997.
Cumberland, RW et al., "Thermal Control of Metathesis Reactions Producing GaN and InN", J. Phys. Chem B, 105, pp. 11922-11927, 2001.
Gonsalves, KE et al., "Optical and microstructural characterization of chemically synthesized gallium nitride nanopowders", Appl. Phys. Lett 71 (15), pp. 2175-2177, Oct. 13, 1997.
Grocholl, L et al., "Solvothermal Azide Decomposition Route to GaN Nanoparticles, Nanorods, and Faceted Crystallites", Chem. Mater. 13, pp. 4290-4296, 2001.
Hwang, JW et al., "Topochemical Control in the Solid-State Conversion of Cyclotrigallazane into Nanocrystalline Gallium Nitride", Chem. Mater. 7, pp. 517-525, 1995.
Janik, JF et al., "Gallium Imide, {Ga(NH)3/2}m a New Polymeric Precursor for Gallium Nitride Powders", American Chemical Society, 4 pgs., 1996.
Jung, WS et al. "Reaction intermediate(s) in the conversion of β-gallium oxide to gallium nitride under a flow of ammonia", Materials Letters 57, pp. 110-114, Nov. 2002.

(Continued)

*Primary Examiner*—Robert M Kunemund
(74) *Attorney, Agent, or Firm*—Calfee, Halter & Griswold LLP

(57) ABSTRACT

Colloidal nanocrystals or "quantum dots" of GaN are directly produced by heating amidogallium dimer, i.e., $(Ga_2[N(CH_3)_2]_6)$, in the presence of a functional amine. The GaN quantum dots obtained, which comprise isolated particles 2-3 nm in diameter with a relative broad size distribution (e.g., 20% standard deviation) exhibit strong exciton confinement.

16 Claims, 4 Drawing Sheets

Two Theta (degrees)

OTHER PUBLICATIONS

Liu, HL et al. "Infrared and Raman-scattering studies in single-crystalline GaN nanowires", Chemical Physics Letters 345, pp. 245-251, Sep. 14, 2001.

Micic, OI et al., "Synthesis, structure, and optical properties of colloidal GaN guantum dots", Applied Physics Letters, vol. 75, No. 4, pp. 478-480, Jul. 26, 1999.

Mueller, AH et al., "Multicolor Light-Emitting Diodes Based on Semiconductor Nanocrystals Encapsulated in GaN Charge Injection Layers", Nano Letters, vol. 5, No. 6, pp. 1039-1044, 2005.

Murray, CB et al., "Syntehsis and Characterization of Monodisperse Nanocrystals and close-packed nanocrystal Assemblies", Annu. Rev. Mater. Sci., 30, pp. 545-610, 2000.

Sardar, K et al., "New Solvothermal Routes for GaN Nanocrystals", Advanced Materials, 16, No. 5, pp. 425-429, Mar. 5, 2004.

Sardar, K et al., "A Simple single-source precursor route to the nanostructures of Aln, GaN and InN", J. of Materials Chemistry, vol. 15, pp. 2175-2177, 2005.

Trodahl, HJ et al., "Raman Spectroscopy of nanocrystalline and amorphous GaN", J. of Applied Physics, 97, 084309-1 through 084309-5, 2005.

Wallace, CH et al, "Solid-state metathesis reactions under pressure: A rapid route to crystalline gallium nitride" Applied Physics Letters, vol. 72, No. 5, pp. 596-598, Feb. 2, 1998.

Wallace CH et al "Rapid Synthesis of Crystalline Gallium Nitride from Solid Precursors at Atmospheric Pressure" American Chemical Society, vol. 11, No. 9, pp. 2299-2301, 1999.

Wang, J et al., "Facile Azidothermal Metathesis Route to Gallium Nitride Nanoparticles", Nano Letters, vol. 2, No. 8, pp. 899-902, plus three (3) supplemental pages, 2002.

Webster's Ninth New Collegiate Dictionary, Period Table of Elements, p. 874, Merriam-Webster, Inc., 1985.

Wells, RL et al., "Heterogeneous solution reactions between MBr3 (M=Ga, In) and Li3N. Formation and characterization of nanocrystalline GaN powders", Eur. J. Solid State Inorg. Chem., 33, pp. 1079-1090, 1996.

Xie, Y et al., "A Benzene-Thermal Synthetic Route to Nanocrystalline GaN", Science, vol. 272, pp. 1926-1927, Jun. 28, 1996.

Xie, Y et al., "Coexistence of wurtzite GaN with zinc blende and rocksalt studied by x-ray power diffraction and high-resolution transmission electron microscopy", Appl. Phys Lett. 69 (3), pp. 334-336, Jul. 15, 1996.

Xu, F et al., "Single-Crystalline Gallium Nitride Microspindles: Synthesis, Charadcterization, and Thermal Stability", Adv. Funct. Mater. 14, No. 5, pp. 464-470, May 2004.

Zhang J. et al., "Morphology and Raman scattering spectrum of GaN nanowires embedded in nanochannels of template", J. Phys D. Appl. Phys. 35, pp. 1481-1485, 2002.

Zhao, H et al., "Route to GaN and VN Assisted by Carbothermal Reduction Process", J. Am. Chem. Soc. 127, pp. 15722-15723, 2005.

Pan, G. et al., "A New Pyrolysis Route to GaN Quantum Dots", Chem. Mater., 13, 4 pages, 2005.

Pan G. et al., "Room Temperature Synthesis of GaN Nanopowder", Chem. Mater. 14, 4 pages, 2006.

Science Blog, "Novel multi-color light-emitting diodes developed", by BJS, created May 18, 2005, 2 pages, from http://www.scienceblog.com/cms/node/7935/print.

Los Alamos National Laboratory, "Scientists develop novel multi-color light emitting diodes", May 17, 2005, 2 pages, from http://lanl.gov/news/index.php?fuseaction=home.story&story_id=6597&view=print.

Physorg.com, "Scientists develop novel multi-color light-emitting diodes", May 18, 2005, 2 pages, from http://physorg.com/news4152.html.

Science Daily, "Scientists Develop Novel Multi-color Light-emitting Diodes", May 18, 2005, 2 pages, from http://www.sciencedaily.com/print.php.

* cited by examiner

DIRECT PYROLYSIS ROUTE TO GAN QUANTUM DOTS

ACKNOWLEDGEMENT

The work described herein was supported by the National Science Foundation under Grant No. (ECS-0210216).

BACKGROUND

GaN is a technologically important semiconductor for development of short wavelength optoelectronic devices. See, Nakamura, S.; Pearton, S. J.; Fasol, G. *The Blue Laser Diode: The Complete Story*, 2nd ed.; Springer-Verlag: New York, N.Y., 2000. Colloidal nanocrystals or "quantum dots" made from this material are expected to combine good thermal, chemical and radiation stability with excellent optical properties and have already been used in making light-emitting diodes. See, Los Alamos National Laboratory Press Release, May 17, 2005.

Although colloidal GaN quantum dots have been an important target material for some time, they have proven to be difficult to synthesize and to study. See, Benaissa et al., *Phys. Rev. B* 1996, 54, 17763 and Mićić et al., *Appl. Phys. Lett.* 1999, 75, 478. Methods to produce colloidal GaN quantum dots include pyrolysis of polymeric gallium imide and the reaction of gallium cupferron with hexamethyldisilazane. See, the above-noted Mićić et al. article (*J. Appl. Phys. Lett.* 1999, 75, 478); Janik et al., *Chem. Mater.* 1996, 8, 2708; and Sardar et al., *Adv. Mater.* 2004, 16, 425. Complexes of $GaCl_3$ with urea have also been converted to nanostructured GaN upon thermal decomposition. See, Sardar et al., *J. Mater. Chem.* 2005, 15, 2175.

In spite of these promising results, the development of new and improved routes to GaN quantum dots remains an important goal.

SUMMARY OF THE INVENTION

In accordance with the invention, colloidal nanocrystals or "quantum dots" of GaN are produced by the direct pyrolysis of amidogallium dimer, i.e., $(Ga_2[N(CH_3)_2]_6)$. The GaN quantum dots obtained, which comprise isolated particles 2-3 nm in diameter with a relatively broad size distribution (e.g., 20% standard deviation), exhibit strong exciton confinement.

Thus, the present invention provides a new process comprising heating an amidogallium oligomer having no more than 10 amidogallium groups in the presence of ammonia, a primary amine, a secondary amine or mixtures thereof to directly produce colloidal GaN nanocrystals.

BRIEF DESCRIPTION OF THE DRAWINGS

The present invention may be more readily understood by reference to the following drawings wherein.

DETAILED DESCRIPTION

Figure 1:
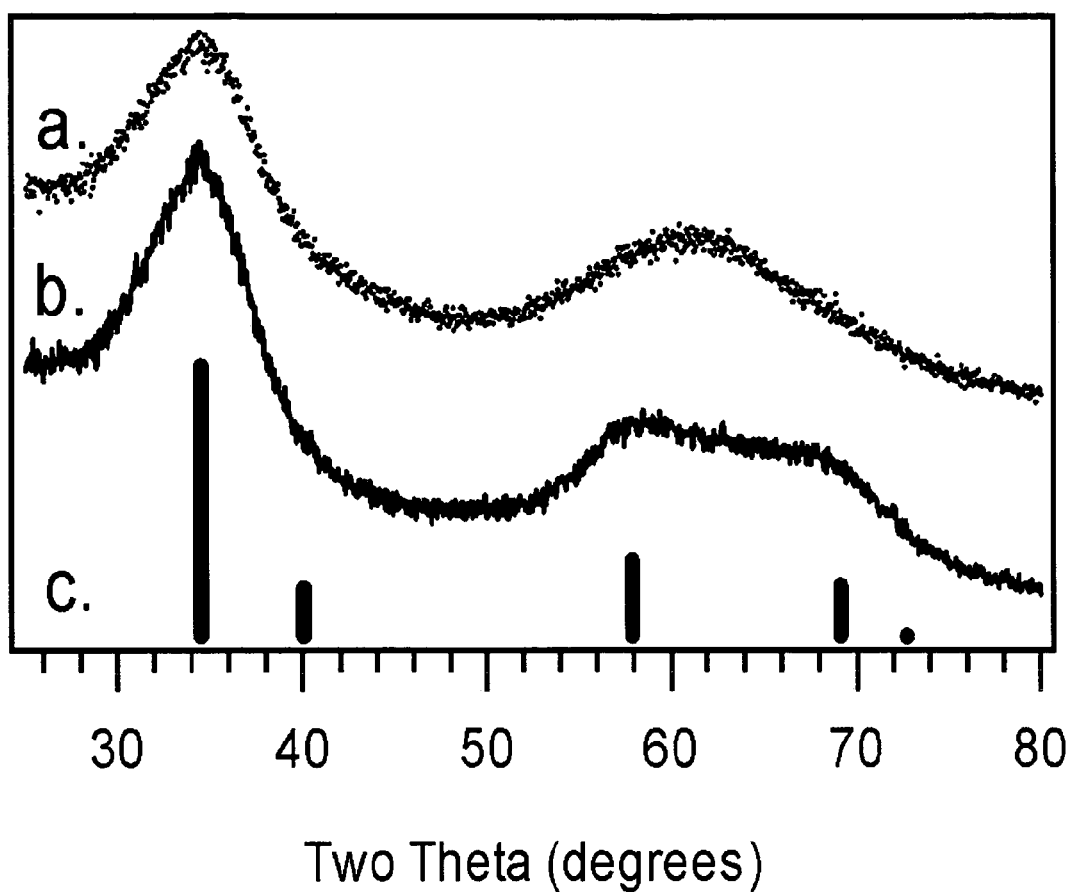
FIG. 1 illustrates the powder x-ray diffraction pattern of two colloidal GaN nanocrystal products obtained in the following working examples, curve "a" representing the product obtained after a 24 hour reaction time and curve "b" representing the product obtained after a 60 hour reaction time.

As described in their article (*J. Appl. Phys. Lett.* 1999, 75, 478), Mićić et al. produced GaN quantum dots by a two-step processes in which amidogallium dimer, i.e., $(Ga_2[N(CH_3)_2]_6)$ is polymerized to form poly(imidogallane) in a first step and the polymer so formed then pyrolyzed by heating in a high-boiling, coordinating solvent mixture in a second step. Unfortunately this first reaction step, polymerization, must be done at high temperature in the presence of liquid or gaseous ammonia, which is difficult and hazardous. Moreover, the poly(imidogallane) intermediate has poor solubility in the solvents used. As a result yields of the desired product, GaN particles in the nano-size range, are low because much of the polymer precipitates out in bulk. In addition, control of particle size is difficult. Furthermore, the nano-sized colloidal particles obtained may exhibit signs of quantum confinement in the UV-visible absorption spectra. For example, no band-edge photoluminescence emission was observed in samples of colloidal GaN nanoparticles made by the Mićić et al. technology, perhaps due to poor surface capping of the GaN nanocrystals.

In accordance with the present invention, it has been discovered that the same dimeric amidogallium precursor used in the Mićić et al. technology, i.e., $(Ga_2[N(CH_3)_2]_6)$, can be converted directly to colloidal GaN nanoparticles, i.e., without producing and recovering a polymeric intermediate first provided that ammonia or other functional amine is also present. This is illustrated in the following schematic flow scheme in which the two-step Mićić et al. technology is depicted on top and the invention process depicted below:

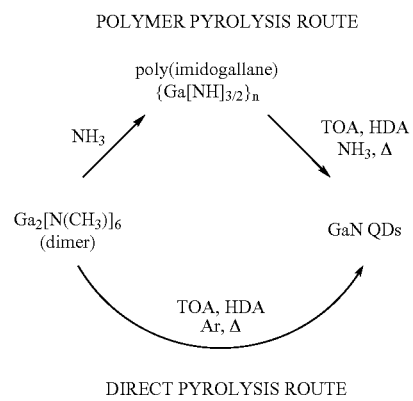

As shown in this depiction, an important feature of the two-step Mićić et al. technology is that a polymer intermediate, poly(imidogallane) is produced and isolated, i.e., recovered as a distinct reaction product, in the first reaction step. Then in a second distinct step normally temporally separated from the first reaction step, this poly(imidogallane) polymer intermediate is heated to elevated temperature in the presence of tri-n-octylamine (TOA) and hexadecylamine (HDA) to decompose the polymer, thereby producing the desired colloidal GaN nanoparticle product. In accordance with the present invention, however, it has been found that the amidogallium reactant used in this technology, i.e., $(Ga_2[N(CH_3)_2]_6)$, can be directly converted to the desired colloidal GaN nanoparticle by application of heat in the presence of ammonia or other functional amine without separately producing and isolating the polymer intermediate first. Thus, the inventive process can be carried out in a single reaction step rather than the two reaction steps required by the Mićić et al. technology.

At the time this disclosure is being written, it is unclear whether the poly(imidogallane) polymer intermediate formed in the two-step Mićić et al. technology is also formed in the inventive process. What is clear, however, is that it is unnecessary in the inventive process to form and separately isolate this polymer intermediate before heating the amidogallium reactant to form the desired colloidal GaN nanoparticle product. Therefore, it should be appreciated that by "direct formation" in this disclosure is meant formation without separately isolating the poly(imidogallane) polymer intermediate.

Reactants

The inventive process is a pyrolysis reaction in which the reactant decomposes to yield the desired colloidal GaN nanoparticle product. For this purpose, the inventive process normally uses the same reactant used in the Mićić et al. technology, i.e., dimeric amidogallium or $(Ga_2[N(CH_3)_2]_6)$. Dimeric amidogallium is well known and can be prepared by the method described in the above-noted Janik et al article (*Chem. Mater.* 1996, 8, 2708).

Other amidogallium oligomers having no more than 10 amidogallium groups such as amidogallium trimer, quatramer, pentamer, hexamer and heptamer can also be used. It is also believed that analogous amidogallium compounds can also be used, i.e., compounds in which one or both of the methyl groups were replaced with a different $C_2$-$C_{12}$ hydrocarbon moiety such as ethyl, propyl, butyl, heptyl, hexyl, 2-ethyl hexyl, phenyl, or $C_1$-$C_6$ alkyl phenyl, for example.

Functional Amine

Another important ingredient in the inventive reaction is a "functional amine," by which is meant ammonia or a primary or secondary amine. Primary and secondary alkyl amines having molecular weights of up to about 550 Daltons, normally about 150 to 550 Daltons, are useful as are aryl amines, amine compounds that also contain other functional groups not interfering with the inventive reaction, and molecules containing multiple amine functionalities (polyamines). Common examples of primary amines would include hexylamine, cyclohexylamine, and benzylamine, while the secondary amines would include dimethylamine, dipropylamine, and piperidine. Common polyamines would include putrescine, spermine, and spermidine. These compounds can be in either a liquid or gaseous state, or both, under the particular reaction conditions employed.

As indicated above, it is unclear as of this writing whether a polymer intermediate forms in the inventive process. Moreover, it is also unclear whether this functional amine ingredient serves a reactant or a catalyst or provides some other functionality. On the other hand, including ammonia in the reaction system especially when a capping ligand is present has led to some very good results. Primary and secondary amines are believed to provide similar results. In contrast, the reaction does not occur at a reasonable pace if trioctylamine, a tertiary amine, is the only adjunct present. Therefore, it is preferred that ammonia, a primary amine, a secondary amine or mixtures thereof be present.

Solvent

The inventive process is carried out in the liquid phase with the amidogallium reactant being dispersed and preferably dissolved therein. In this context, "liquid phase" includes reactions carried out by refluxing the reaction system.

Suitable solvents include the functional amine described above including any capping ligands that might be present, as further discussed below. Other suitable solvents include non-reactive liquids, i.e., liquids which do not react to any significant degree with the amidogallium reactant or the colloidal GaN nanocrystal product, which boil at or above the reaction temperature employed and which are capable of dissolving (or at least finely dispersing) the amidogallium reactant. In this context, "finely dispersing" means forming a dispersion in which the particle size of the dispersed phase is no greater than about 100 nm. Preferably, the particle size will be no greater than about 10 nm.

Particular examples of suitable solvents are described in the above-noted Mićić et al. article (*J. Appl. Phys. Lett.* 1999, 75, 478), with trioctylamine and hexadecylamine and particularly mixtures thereof, being especially interesting. Other high-boiling organic liquids (i.e., organic liquids which boil at temperatures above the reaction temperature being used) can also be used such as, for example, long chain hydrocarbons (e.g., $C_{16}$-$C_{40}$ alkanes such as octadecane), primary, secondary and tertiary alkyl amines having molecular weights of up to about 550 Daltons, normally about 150 to 550 Daltons, (e.g. trioctylamine) and alkyl phosphines having molecular weights of about 150 to 550 Daltons (e.g. trioctylphosphine).

Reaction Temperature

As indicated above, the inventive process is a pyrolysis reaction carried out by heating the amidogallium reactant for a time and at a temperature to cause its decomposition into the desired colloidal GaN nanoparticle product. This reaction is most conveniently carried out at atmospheric pressure in which case the reaction temperature will typically be about 150-450° C. Normally, the reaction temperature will between about 250-350° C., since the reaction rate decreases rapidly below about 250° C. while temperatures above about 400-450° C. may lead to decomposition of the colloidal GaN nanoparticle product as well as destruction of the reaction vessel especially if made from glass. Changes in these temperatures may be necessary or appropriate if the reaction is carried out at elevated or reduced pressures.

Reactant Concentrations

There is no real technical limit on the concentration of the amidogallium reactant in the solvent, as the reaction will proceed at any concentration. From a practical standpoint, however, the concentration of the amidogallium reactant in the solvent will normally be between about 0.001 molar to 5 molar, more typically 0.01 molar to 2 molar or even 0.1 molar to 1 molar.

Atmosphere

To reduce potential adverse reactions, it is desirable to carry out the inventive reaction in an inert atmosphere such as argon or nitrogen, or at least in a reaction system in which access to the atmosphere is substantially restricted such as in a closed vessel, for example. However, this is not absolutely necessary.

Reaction Times

The time needed to carry out the inventive reaction depends on a number of factors including the particular starting material and solvent used, the reaction temperature and pressure and the desired degree of conversion of the amidogallium reactant to product.

When amidogallium dimer is the reactant and the reaction temperature is about 250° C., reaction times as short as 1 hour and as long as one week can be used. In general, however, reaction times will be on the order of 20-80 hours, more typically about 24-60 hours, to achieve substantial conversion of reactant to product.

Capping Ligands

As the amidogallium reactant decomposes, GaN particles are formed. Initially, these particles are small but they may grow or agglomerate as the reaction proceeds. In order to hinder particle agglomeration and growth, an optional capping ligand can be included in the reaction system, if desired.

Any organic chemical which will not boil off at the reaction temperature used and which will attach to the surfaces of the nascent GaN particles, thus preventing or retarding contact between these particles and additional particles and/or amidogallium reactant, can be used for this purpose. Examples are Lewis bases, since they form bonds of moderate strength with metals such as the Ga of the GaN particles. Specific examples include thiols, thiolates, esters, amines, alcohols, alkoxides, phosphines, phosphine oxides, aldehydes, and ketones. Trioctylphosphine oxide is especially interesting.

The amount of capping ligand included in the reaction system can vary widely and depends, in general, on the strength of the interaction between the ligand and the surface of the particles. Although essentially any amount can be used, the amount will normally be such that the amidogallium: ligand molar ratio is between about 0.01 and 100, more typically between about 0.1 and 10.]

The effectiveness of the capping ligand will depend at least in part on the reaction temperature, since higher temperatures tend to drive off the ligand of the GaN particle surfaces. Therefore, due regard should be paid to the anticipated reaction temperature to be used in a particular embodiment of the invention when selecting the capping ligand for this embodiment.

WORKING EXAMPLES

In order to more thoroughly illustrate the invention, the following working examples are presented. In these examples, colloidal GaN nanoparticles are prepared by the inventive process and then analyzed by a variety or different techniques to determine their properties.

In these examples amidogallium dimer, $(Ga_2[N(CH_3)_2]_6$, was first prepared according to the method of the above-noted Janik et al. article (*Chem. Mater.* 1996, 8, 2708) by combining 2 g $GaCl_3$ and 1.8 g $LiN(CH_3)_2$ in 100 ml of mixed hexanes in an Ar-filled glovebox and reacting the mixture for 2 days at room temperature.

The amidogallium dimer so obtained was then isolated from the hexane mixture under vacuum and then added to a solvent comprising a mixture of 4 ml tri-n-octylamine (TOA) and 1 g hexadecylamine (HDA). The reaction mixture so obtained was charged into an evacuated, roundbottom reaction flask and then heated to reflux (about 250° C.) under an atmosphere of Ar to effect pyrolysis of the amidogallium dimer and direct conversion of the pyrolysis product into colloidal GaN nanocrystals.

Two batches of colloidal GaN nanocrystals were produced. In the first, the pyrolysis reaction was carried out for 24 hours. In the second, pyrolysis was carried out for 60 hours. For convenience, these GaN nanocrystals are referred to herein the "24 hour Product" and the 60 hour Product."

The GaN nanocrystals obtained were recovered from their gross reaction products by high-speed centrifugation (~10, 000 rpm for 20 minutes), and then the solvent was removed with a pipet. The powder obtained was washed with hexanes to remove residual TOA, HDA, or unreacted starting material. This powder was allowed to dry at room temperature and three portions were taken from this. One batch of the powder was used as the dry powder for x-ray diffraction studies, one was mixed with KBr and pressed into a pellet for Fourier transform infrared studies, and one batch was suspended in methanol to make an optically clear suspension for UV-visible absorption measurements and photoluminescence measurements.

Powder x-ray diffractometry measurements were obtained on both products, i.e. the 24 hour Product and the 60 hour Product, the results of which are illustrated in FIG. 1. As can be seen from this figure, both products yielded broad peaks characteristic of nanosized crystalline GaN domains. In the case of the 24 hour Product, which is represented by curve "a", only two broad peaks were observed at 35° and 62°. In contrast, three peaks were observable in connection with the 60 Product, which is represented by curve "b." In any event, both diffraction patterns obtained closely resemble the diffraction pattern for GaN nanocrystals published in earlier accounts describing the synthesis of nanocrystalline GaN powders from poly(imidogallane). See, the above-noted Mićić et al. article (*J. Appl. Phys. Lett.* 1999, 75, 478); the above-noted Janik et al. article (*Chem. Mater.* 1996, 8, 2708); Wells et al., *Eur. J. Solid State Inorg. Chem.* 1996, 33, 1079; and Gonsalves et al., *Appl. Phys. Lett.* 1997, 71, 2175. The obtained data also matches the known d-spacings and peak intensities of zincblende GaN as shown in Hwang et al., *Chem. Mater.* 1995, 7, 517, which are represented by the vertical lines denoted as "c." at the bottom of FIG. 1.

Additional characterizations of the two products described above were done by FTIR, XRD, photoluminescence and TEM measurements. For this purpose, the GaN nanocrystals from the two colloidal GaN products described above were recovered in high yield by centrifugation, and the recovered solid from each batch was washed with copious amounts of hexanes. For the FTIR analysis, the hexane-washed GaN nanocrystal were simply dried, thereby producing a whitish-yellow powder. For the spectroscopic studies and TEM grid preparation, the washed particles were suspended in methanol to produce optically clear suspensions. Approximately 50% of the GaN product in each reaction mixture was recovered in these clear methanol suspensions.

FTIR analyses were then conducted on both products using a Shimadzu Advantage FTIR-8400 Fourier-transform infrared spectrophotometer. For both products, a single, broad, intense peak was observed in the FTIR spectrum near 600 $cm^{-1}$, matching spectra of GaN obtained by the polymer pyrolysis method as well as literature reports. See, Jung, *Mater. Lett.* 2002, 57, 110. The single, broad, peak at 600 $cm^{-1}$ differentiates these reaction products from the most likely alternative, $\beta$-$Ga_2O_3$, which gives two distinct peaks near 450 and 700 $cm^{-1}$.

Figure 2:
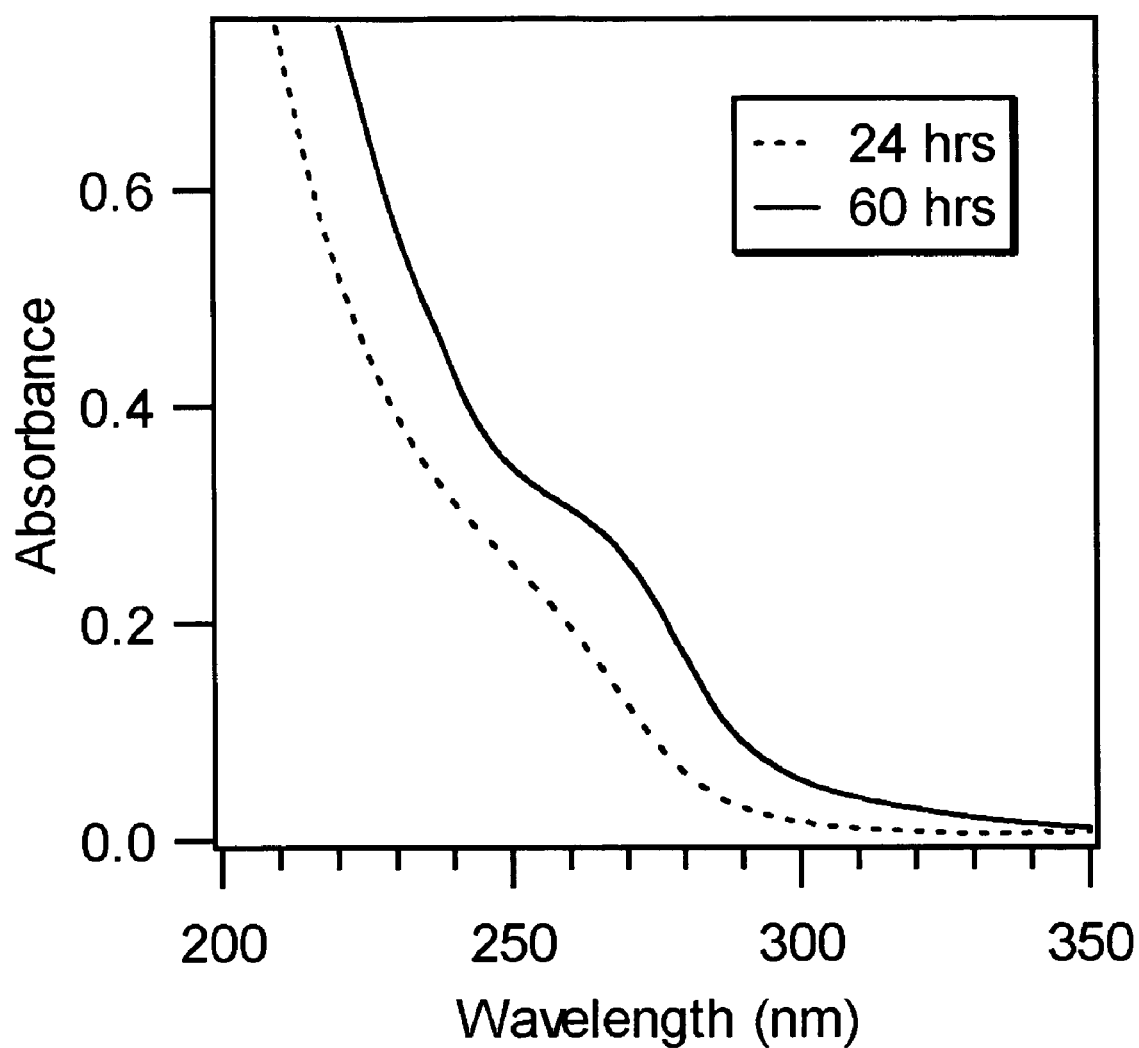
FIG. 2 illustrates the UV-visible absorption spectrum of the two GaN products referred to above in connection with FIG. 1.

The absorption spectra of both products was then obtained using an Agilent Technologies model 8453 diode array UV-visible absorption spectrophotometer. FIG. 2 shows UV-visible absorption spectra for the two products, with curve "a" representing the 24 hour Product and curve "b" representing the 60 hour Product. Each spectrum shows an absorption edge in the ultraviolet that is blue-shifted relative to the absorption edge of bulk GaN (365 nm). This blue shift is expected for nanoscale particles and is the result of spatial confinement of the exciton. While the broad x-ray diffraction peaks shown in FIG. 1 do indicate small crystalline domains within the solid, they cannot provide direct evidence for small particle size. On the other hand, the absorption data in FIG. 2, which show strong evidence for excitonic quantum confinement, do suggest the presence of separated, nano-sized, GaN particles. Both spectra in FIG. 2 are shoulders on a large, sloping absorption background that increases with decreasing wavelength. Such spectra are typically associated with broad quantum dot size distributions and can be contrasted with the spectra obtained from monodisperse suspensions, which exhibit a series of narrow, well-resolved peaks. See, Murray et al., *Annu. Rev. Mater. Sci.* 2000, 30, 545. In spite of the broad size distributions, the differences between the two spectra provide initial evidence that this new method allows some control over the particle size distribution. This possibility represents a further advantage of the inventive method as compared with the previously reported polymer pyrolysis routes.

Figure 3:
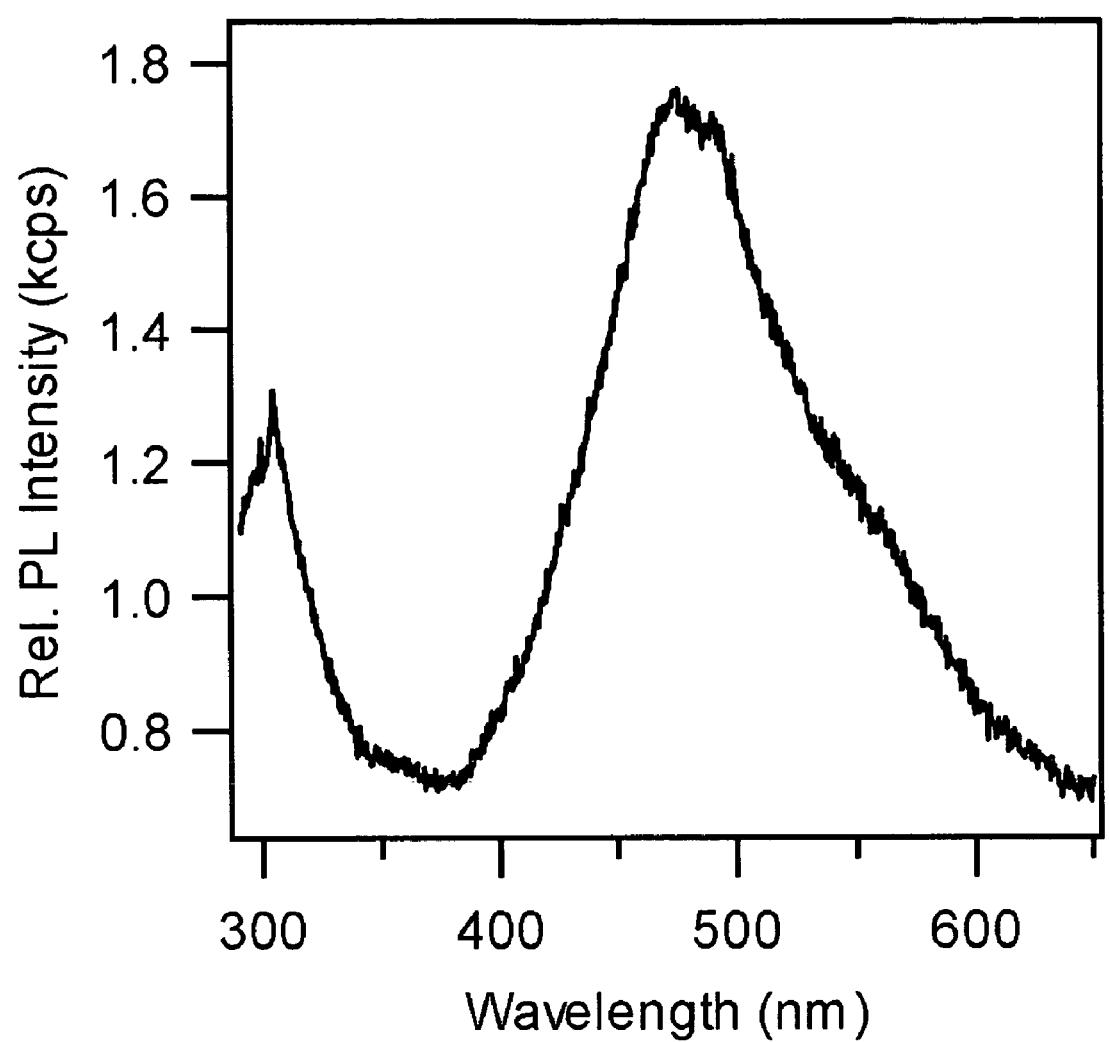
FIG. 3 illustrates the photoluminescence emission spectra of the two GaN products referred to above in connection with FIG. 1.

FIG. 3, which is the photoluminescence (PL) emission spectra of the 24 hour Product obtained by a Photon Technology International model C-60 steady-state fluorimeter with arc lamp excitation, also shows evidence of quantum confinement. Room temperature PL emission is observed near the absorption edge with a peak at 305 nm (4.07 eV) suggesting radiative exciton recombination at the bandedge. Broad, visible emission from trap states is also seen in this spectrum. The observation of confinement-shifted PL emission is significant, as reports of quantum-confined PL emission have been rare in colloidal GaN nanocrystals. GaN nanocrystals obtained from pyrolysis of poly(imidogallane) typically emit only in the visible range at room temperature. See, the above-noted Gonsalves et al. article (*Appl. Phys. Lett.* 1997, 71, 2175) as well as Coffer et al., *Chem. Mater.* 1997, 9, 2671. In their article *J. Appl. Phys. Lett.* 1999, 75, 478, Mićić and Nozik observed spectrally broad PL emission which peaked near the bulk GaN bandgap energy, significantly to the red of the absorption edge in their sample.

Figure 4:
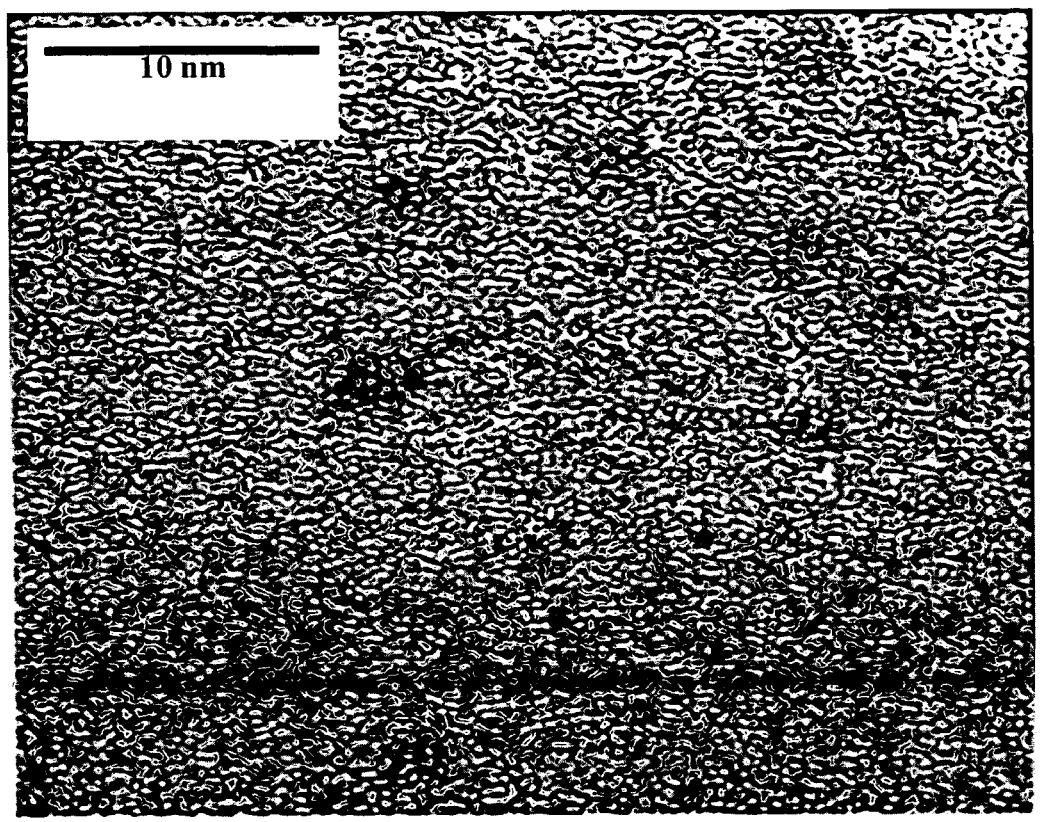
FIG. 4 is a TEM image obtained of the second GaN product mentioned above, i.e., the product obtained after a 60 hour reaction time.

FIG. 4 shows an HRTEM image of the 60 hour Product obtained in a Phillips 2000 high resolution transmission electron microscope. FIG. 4 shows several spherical particles with diameters of 2-4 nm. The extremely small size of these particles and low material density (6 g/cm$^3$) result in low contrast in the electron beam, making these particles difficult to image and measure. The broad size distribution suggested by the optical spectra is confirmed in this TEM image. Although the particle size distribution obtained here is not comparable with those obtained in the highly optimized II-VI systems, it is believed that this reaction will permit improvements through optimization of reaction conditions. The average particle diameter measured from several such images (N=35) is 24 Å with a standard deviation of 4 Å. The effective mass equation when applied to GaN predicts a bandgap energy of 4.8 eV (~260 nm emission) for 24 Å particles. See, Brus, *J. Chem. Phys.* 1984, 80, 4403 as well as the above-noted Wells et al. article (*J. Solid State Inorg. Chem.* 1996, 33, 1079). This equation is known to systematically exaggerate the bandgap of for tiny particles, so the observed relationship between measured particle size and optical bandgap seems reasonable.

From the foregoing, it can be seen that the present invention provides a new route to colloidal GaN nanocrystals which is a significant improvement over the previously reported reaction involving poly(imidogallane). This new method is safer and far simpler since it does not require the use of ammonia. Moreover, this method produces a much higher yield of product compared with colloidal GaN nanocrystals, which is believed due to the good solubility of the dimeric precursor and the ability of the coordinating ligands to cap the particle surfaces as soon as GaN nuclei are formed The nature of this precursor also offers an opportunity to tune particle size by controlling reaction conditions such as precursor concentration, pyrolysis temperature, reaction time, and the identity and concentration of capping ligands. Finally, the GaN nanocrystals of this invention show superior optical characteristics with quantum-confined, excitonic PL emission.

The invention claimed is:

1. The process comprising heating an amidogallium oligomer having no more than 10 amidogallium groups in the presence of ammonia, a primary amine, a secondary amine or mixtures thereof in the liquid phase to directly produce colloidal GaN nanocrystals.

2. The process of claim 1, wherein the amidogallium oligomer is an amidogallium trimer, quatramer, pentamer, hexamer, heptamer or mixture thereof.

3. The process of claim 2, wherein the amidogallium oligomer is amidogallium dimer.

4. The process of claim 3, wherein pyrolysis is accomplished by heating the amidogallium oligomer to a temperature of about 250-450° C.

5. The process of claim 4, wherein the amidogallium oligomer is dissolved in a solvent.

6. The process of claim 5, wherein the solvent is a $C_{16}$-$C_{40}$ hydrocarbon, a primary, secondary and tertiary alkyl amines having a molecular weight of about 150 to 500 Daltons, an alkyl phosphine having a molecular weight of about 150 to 500 Daltons, or a mixture thereof.

7. The process of claim 6, wherein the solvent is octadecane, trioctylamine, hexadecyl amine, trioctylphosphine or a mixture thereof.

8. The process of claim 4, wherein a capping ligand is included in the solvent, the capping ligand being a Lewis base.

9. The process of claim 8, wherein the capping ligand is a thiol, ester, amine, alcohol, aldehyde, ketone or mixture thereof.

10. The process of claim 9, wherein the capping ligand is trioctylphosphine oxide.

11. The process of claim 1, wherein the amidogallium oligomer is dissolved in a solvent.

12. The process of claim 11, wherein the solvent is a $C_{16}$-$C_{40}$ hydrocarbon, a primary, secondary and tertiary alkyl amines having a molecular weight of about 150 to 500 Daltons, an alkyl phosphine having a molecular weight of about 150 to 500 Daltons, or a mixture thereof.

13. The process of claim 12, wherein the solvent is octadecane, trioctylamine, hexadecyl amine, trioctylphosphine or a mixture thereof.

14. The process of claim 1, wherein a capping ligand is included in the solvent, the capping ligand being a Lewis base.

15. The process of claim 14, wherein the capping ligand is a thiol, ester, amine, alcohol, aldehyde, ketone or mixture thereof.

16. The process of claim 15, wherein the capping ligand is trioctylphosphine oxide.

* * * * *